United States Patent [19]
Erhardt

[11] Patent Number: 5,066,994
[45] Date of Patent: Nov. 19, 1991

[54] IMAGE SENSOR

[75] Inventor: Herbert J. Erhardt, Rochester, N.Y.

[73] Assignee: Eastman Kodak Company, Rochester, N.Y.

[21] Appl. No.: 331,156

[22] Filed: Mar. 31, 1989

[51] Int. Cl.[5] ............................................. H01L 29/78
[52] U.S. Cl. ...................................... 357/24; 357/30; 250/211 J
[58] Field of Search ................ 357/24 LR, 24 M, 24, 357/30 H, 30 D, 30 L; 250/211 J, 211 R

[56] References Cited

U.S. PATENT DOCUMENTS

| | | | |
|---|---|---|---|
| 4,031,315 | 6/1977 | Pfleiderer | 358/212 |
| 4,137,543 | 1/1979 | Beneking . | |
| 4,274,104 | 6/1981 | Fang et al. . | |
| 4,575,762 | 3/1986 | Aandrews, II. et al. | 357/24 LR |
| 4,641,963 | 2/1987 | Levine | 356/124.5 |
| 4,656,519 | 4/1987 | Savage | 3578/24 (L-R) |
| 4,665,420 | 5/1987 | Kosonocky et al. | 357/24 M |
| 4,665,420 | 5/1987 | Kosonocky et al. | 357/24 |
| 4,724,470 | 2/1988 | Van Santen et al. | 357/24 M |
| 4,757,210 | 7/1988 | Bharat et al. . | |
| 4,814,844 | 3/1989 | Bluzer | 357/24 M |

FOREIGN PATENT DOCUMENTS

| | | | |
|---|---|---|---|
| 50-42370 | 3/1983 | Japan | 357/24 LR |
| 2103876 | 2/1983 | United Kingdom | 357/24 LR |

OTHER PUBLICATIONS

IBM, vol. 19, No. 11 Apr. 1977 High speed scanner photoelement with gain. S. G. Chamberlain.

Primary Examiner—Jerome Jackson, Jr.
Assistant Examiner—Hung X. Dang
Attorney, Agent, or Firm—Donald D. Schaper

[57] ABSTRACT

An image sensor is disclosed which comprises a plurality of image sensor elements arranged in rows and columns. Each of the image sesnor elements includes a a CCD. In order to provide an image sensor which can be used to image in different image formats, the image sensor includes imaging planes on edge surfaces as well as on a top surface. The top and bottom layers of the sensor are of an increased doping level, and these layers serve to guide charge carriers into CCD's located adjacent the edges of the sensor.

15 Claims, 3 Drawing Sheets

IMAGE SENSOR

BACKGROUND OF THE INVENTION

1. Field of the Invention

The present invention relates to an image sensor, and more particularly, to an image sensor which includes multiple imaging planes.

2. Description of the Prior Art

Typical charge-coupled device (CCD) image sensors are formed on flat, circular semiconductor substrates known as wafers. Image sensor elements are fabricated on either a top or bottom surface of the wafer by means of various doping layers of several microns in depth. Upon completion of the image sensor elements, the die is cut from the wafer and mounted in a package where either the top or bottom surface is exposed for illumination.

In U.S. Pat. No. 4,031,315, there is shown a CCD image sensor which comprises image sensor elements arranged in matrix form on one surface of the image sensor. In one embodiment, the image sensor can be irradiated on a top surface, and in a second embodiment, the substrate body is made sufficiently thin that the sensor can be irradiated on a bottom surface. There is a problem in using this image sensor in certain applications; for example, the sensor cannot be used in apparatus where it is desired to simultaneously image two opposing surfaces. In such an application, two separate image sensors must be used, and this adds to the expense and complexity of the apparatus.

U.S. Pat. No. 4,665,420, discloses a CCD image sensor which is adapted to receive illumination on a top surface. In order to prevent the injection of undesirable charge carriers into the CCD registers, the image sensor includes a means of passivating the edges of the sensor. The image sensor includes a plurality of space detectors arranged in columns extending along one of the major surfaces of the sensor substrate. Between the edge of the substrate and the adjacent column of detectors, an edge drain is provided for receiving any charge carriers generated at the edge in order to prevent the charge carriers from being injected into the adjacent detectors. Although charge carriers are being collected in this image sensor from an edge of the sensor, there is no provision for using the charge carriers to record information. Thus, the sensor can only be used to image in a single plane.

SUMMARY OF THE INVENTION

It is an object of the present invention to overcome the problems in the prior art discussed above by providing an image sensor in which information can be recorded through an edge surface of the sensor.

In accordance with one aspect of the present invention, there is provided an image sensor comprising: a semiconductor substrate of a first conductivity type, the substrate having opposed major surfaces and opposed edges between the surfaces, one of the edges having a surface which is receptive to light; an image sensor element formed in the substrate and located adjacent the one edge, the image sensor element including a charge collection and transfer means and an image sensing region in which charge carriers are generated by light impinging on the surface of the one edge; and means in the substrate for guiding charge carriers in the image sensing region toward the charge collection and transfer means.

In one embodiment of the present invention, an image sensor includes an elongated substrate of a P-type material. The image sensor includes an imaging plane on the top surface and imaging planes on two edge surfaces bordering the top surface. The substrate comprises a bottom layer which is highly doped with a P-type material and an upper layer which is more lightly doped with a P-type material. Three columns of image sensor elements are formed in the substrate. One column is adapted to function with the top imaging plane, and the other two columns are adapted to function with the two imaging planes on the edge surfaces. Each of the image sensor elements includes an image sensing region and a charge collection and transfer means which is a buried-channel CCD. The image sensor element which functions with the top imaging plane includes a photodiode in the image sensing region.

A P+ layer is formed in the top surface of the image sensor between each edge surface and the column of image sensor elements adjacent to the edge surface. The increased doping level in the P+ layers on the top and bottom surfaces gives rise to a barrier to electron movement in the direction of the P+ layers. Thus, charge carriers which are created as a result of light energy absorbed through the side edges of the sensor are effectively guided back toward the middle of the substrate where they will diffuse laterally toward the CCD's located along the two edges.

A principal advantage of the present invention is that the image sensor can be used to image in a plurality of planes. This permits the sensor to be used in many image formats such as formats involving the simultaneous imaging of two opposing surfaces or the surface imaging of passageways. Detection of images through the edges is made possible by means of doped layers which create a waveguide-like structure adjacent the edges of the sensor. The present invention can be formed using processing techniques which are compatible with techniques used in forming other types of image sensors, and thus, the invention can be easily incorporated in various types of known image sensors.

Other features and advantages will become apparent upon reference to the following description of the preferred embodiment when read in light of the attached drawings.

DESCRIPTION OF THE PREFERRED EMBODIMENTS

Figure 1:
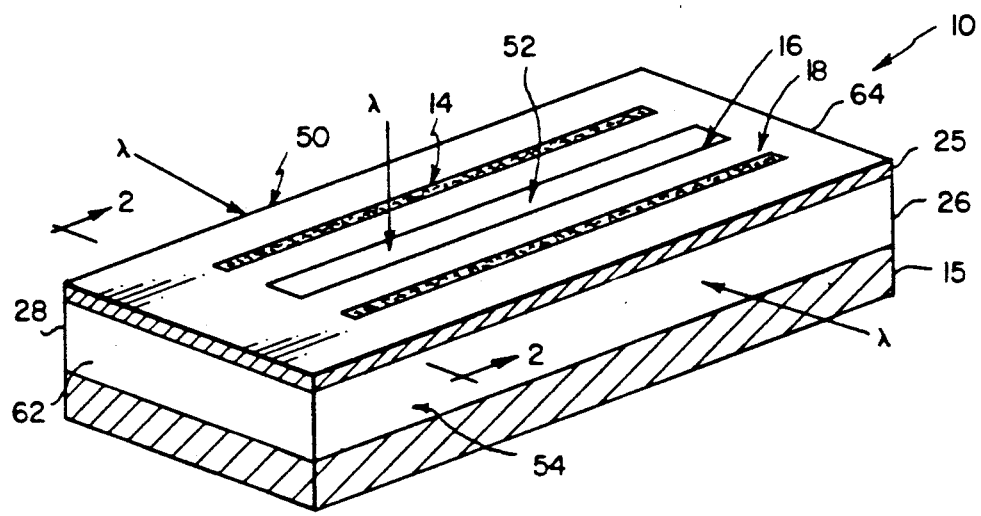
FIG. 1 is a perspective view of the image sensor of the present invention.
Figure 2:
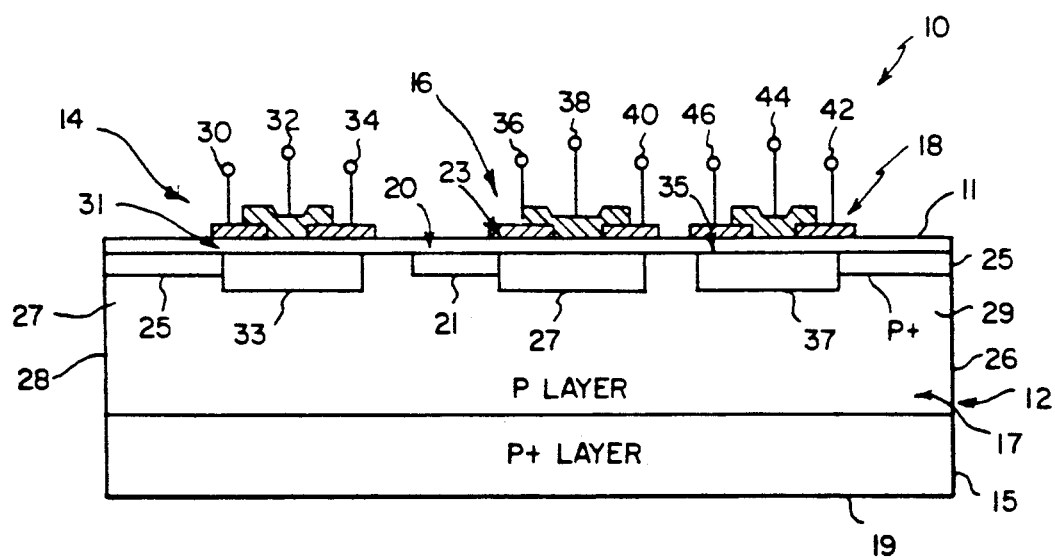
FIG. 2 is sectional view, taken along the line 2—2 in FIG. 1.

With reference to FIGS. 1 and 2, there is shown an image sensor 10 constructed in accordance with the present invention. Image sensor 10 comprises a P-type substrate 12 having major surfaces 11 and 19 and edge surfaces 26 and 28. Substrate 12 includes a highly doped bottom layer 15, labeled P+, and an upper layer 17 which is more lightly doped with a P-type material having a high carrier lifetime. Layer 17 can be fabricated, for example, by using known epitaxial growth techniques. Image sensor elements 14, 16, and 18, are formed in layer 17. Elements 14, 16, and 18 are arranged in rows, as shown in FIG. 2, and in columns along the length of image sensor 10. A P+ layer 25 is formed between the image sensors 14 and 18 and substrate edges 28 and 26 respectively.

As will be apparent from the discussion that follows, the thickness of layer 17 is important since it determines the effective vertical aperture dimension in edges 28 and 26 of the sensor 10. Common thicknesses for epitaxial layers range from 1-20 microns, and this range covers the range of dimensions needed for most CCD detectors. The carrier (electron) lifetime in the P+ layers is low due to the doping level, and hence, these layers will not contribute significantly to the aperture. One suitable thickness for layer 17 is about 10 microns.

Each of the image sensors includes an image sensing region and a charge collecting and transfer means. Image sensor element 16 includes photodiode 20 which functions as the image sensing region and is formed in layer 17 by an N-type region 21. The charge collecting and transfer means in sensor 16 is a buried-channel CCD 23 which is also formed by an N-type region 27. Image sensor element 16 further includes a storage gate 36, a transfer gate 38, and a clock phase terminal 40.

Image sensors 14 and 18 are generally similar to each other, and their charge collecting and transfer means are spaced several microns from the edges 26 and 28 of sensor 10. Image sensor element 14 comprises an image sensing region 27, a buried-channel CCD 31 formed by an N-type region 33, a storage gate 30, a transfer gate 32, and a clock phase terminal 34. Image sensor element 18 comprises an image sensing region 29, a buried-channel CCD 35 formed by an N-type region 37, a storage gate 42, a transfer gate 44, and a clock phase terminal 46.

Figure 3:
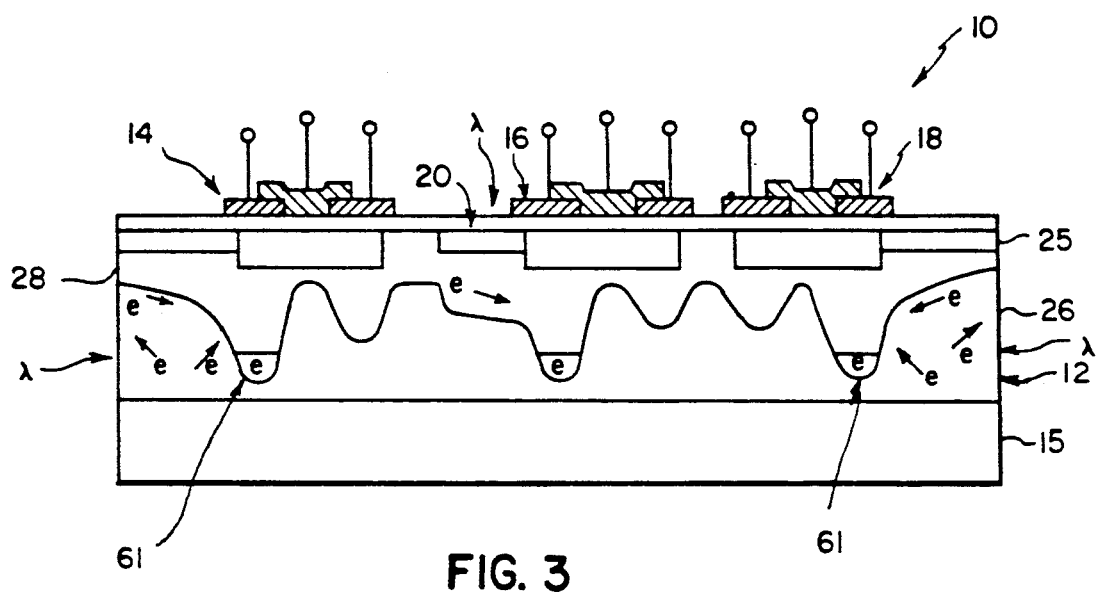
FIG. 3 is a sectional view, similar to FIG. 2, illustrating the potentials within the image sensor.

As shown in FIG. 1, image sensor 10 has a first imaging plane 50 on edge 28, a second imaging plane 52 on a top surface of the sensor 10, and a third imaging plane 54 on edge 26 of the sensor. Image sensor element 16 functions in a conventional manner in response to illumination on plane 52. That is, photons λ impinging on imaging plane 52 will result in charge carriers "e" being collected in photodiode 20. When a voltage is supplied to transfer gate 38, the charge carriers are transferred to CCD 23 (see FIG. 3), and the charge carriers are shifted from the CCD 23 in a direction perpendicular to the surface to the drawing in FIG. 3 by means of clock terminal 40.

Photons λ impinging on imaging planes 50 and 54 generate charge carriers in regions 27 and 29, respectively. The charge carriers are guided toward the CCD's 31 and 35 by the P+ layers 15 and 25 which combine to form a type of electron waveguide in substrate 12. There is no local depletion region adjacent edges 26 and 28 so the carriers are not readily collected. Instead, the carriers are free to diffuse laterally.

Figure 4:
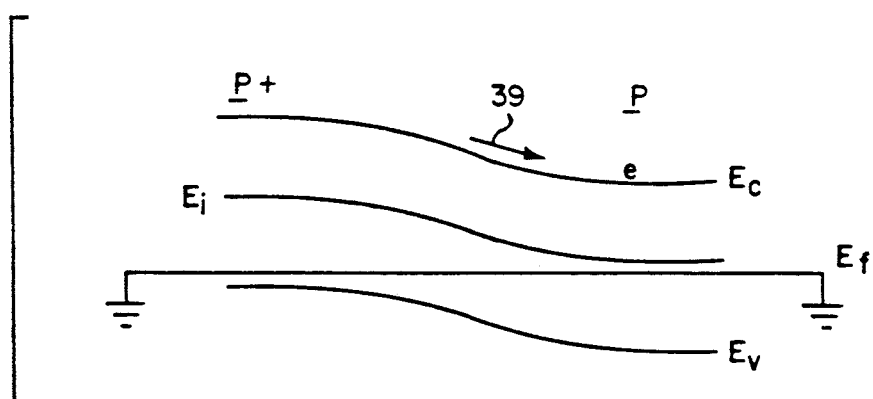
FIG. 4 is an energy band diagram which illustrates the effect of the increased doping levels on electron movement.

The effect of the P+ layers in guiding the charge carriers is illustrated by the energy band diagram in FIG. 4 in which $E_c$ represents the conduction band energy level, $E_v$ is the valence band energy level, $E_i$ is the intrinsic energy level, and $E_f$ is the Fermi level. As demonstrated in FIG. 4, the increased doping level in layers 15 and 25 gives rise to a barrier to electron movement in the direction of these layers. Consequently, the carriers are effectively guided back, as indicated by arrow 39, toward the middle portion of substrate 12 where they will continue to diffuse laterally. Carriers which diffuse toward the edges 26 and 28 will be lost to recombination, but those which diffuse inward toward the CCD's 31 and 35 will eventually encounter the drift field from the storage gate depletion and be collected as signal charge. Since there is no patterning on the edges 26 and 28, the effective horizontal aperture on the edge surfaces is continuous. Pixel separation does not occur until the charge is collected within CCD storage regions 61. The probability of collection is highest in the storage region nearest the point of photon absorption. Charge carriers which are collected adjacent to edges 26 and 28 are transferred to CCD's 31 and 35 by means of voltages supplied to transfer gates 32 and 44, respectively. The carriers are shifted out of the CCD's 31 and 35 in a well-known manner by means of voltages supplied to clock phase terminals 34 and 46.

Figure 5:
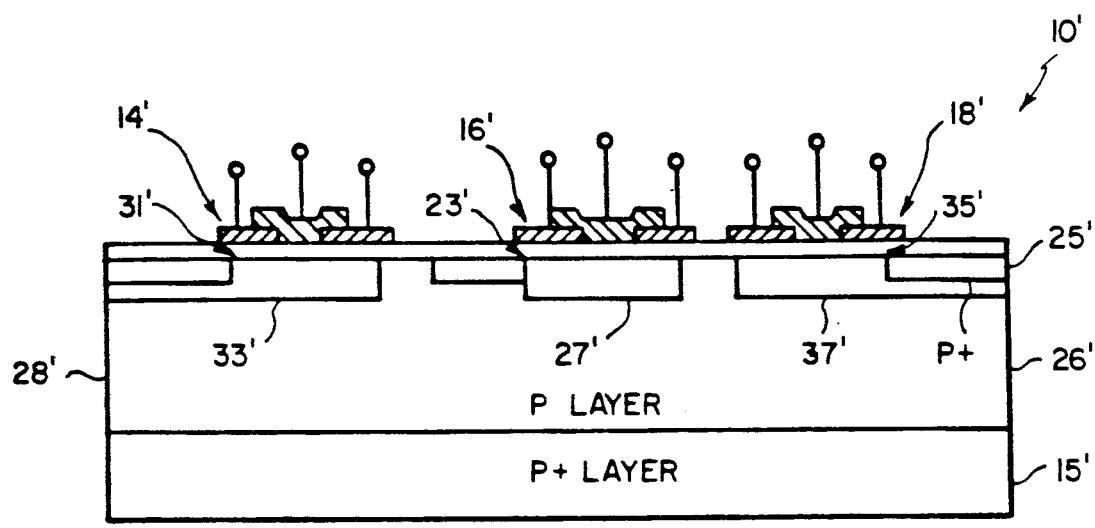
FIG. 5 is a cross-sectional view of a second embodiment of the present invention.

A second embodiment of the present invention is shown in FIG. 5. Shown therein is an image sensor 10' in which elements similar to elements in image sensor 10 are identified with the same reference numeral with a prime added. Image sensor 10' is generally similar to sensor 10, except for CCD's 14' and 18' in which the lightly-doped N-type regions 37' and 33' have been extended to the edges 26' and 28', respectively. This structure effectively increases the lateral extent of the depletion region since the N-type region is coupled to the higher potential from the storage region. As a result, charge collection is improved and crosstalk is reduced.

Figure 6:
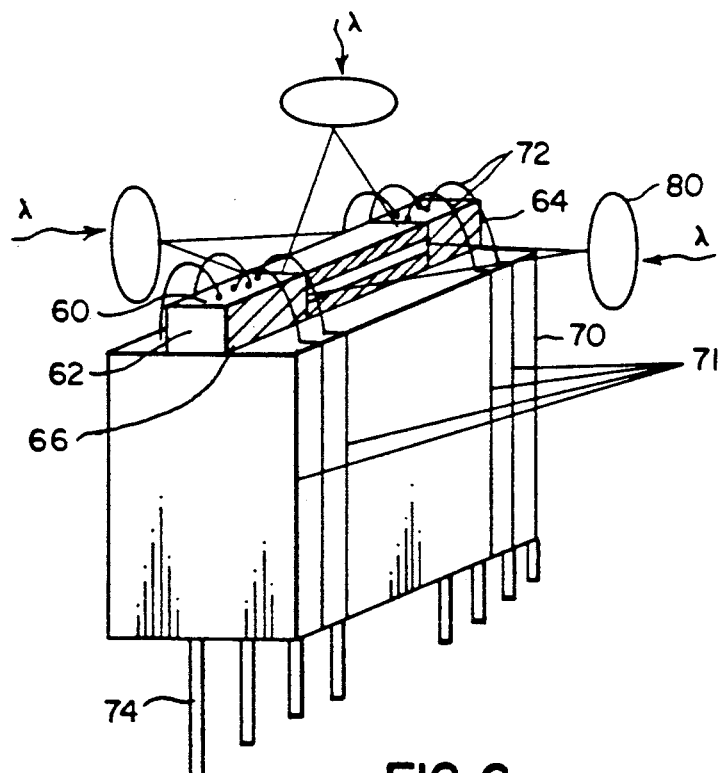
FIG. 6 is a perspective view illustrating one mounting arrangement for the image sensor of the present invention.

With reference to FIG. 6, there is shown a suitable mounting arrangement for image sensor 10. In order to avoid the interference of external connections on an imaging surface, bond pads 60 are shifted to ends 62 and 64 of the sensor 10. An opaque coating 66 can be applied on die edges 26 and 28 to prevent stray light from being absorbed on the die ends. Image sensor 10 is mounted on an insulated support block 70, and interconnects 71 on block 70 are used to make the connections between bond wires 72 and leads 74. An imaging lens 80 is indicated schematically for each of the imaging planes 50-54.

It will be apparent that the image sensors 10 and 10' can be used in various applications. For example, the sensors could be used to simultaneously image a plurality of planes. Further, the concept of forming an imaging plane on an edge of a sensor can be used in an image sensor having any number of columns of image sensor elements on a top surface thereof. The image sensors of the present invention can also be used for color applications in which a red filter is placed over the image sensor elements in one imaging plane, a green filter covers the elements in a second imaging plane, and a blue filter covers the elements in a third imaging plane. In the use of a sensor with the color filters and suitable optics, a color document could be scanned in a single pass of the sensor.

The invention has been described in detail with particular reference to the preferred embodiments thereof, but it will be understood that variations and modifications can be effected within the spirit and scope of the invention.

I claim:

1. An image sensor comprising:
a semiconductor substrate of a first conductivity type, said substrate having opposed major surfaces and opposed edges between said surfaces, one of said edges having a surface which is receptive to light;
an image sensor element formed in said substrate and located adjacent said one edge, said image sensor element including a charge collection and transfer means and an image sensing region in which charge carriers are generated by light impinging on the surface of said one edge, said image sensor element further including means for creating a storage region in said substrate for receiving charge carriers generated by light impinging on said edge surface and means for effecting the transfer of charge carriers from said storage region to said charge collection and transfer means; and
means in said substrate for guiding charge carriers in said image sensing region into said storage region.

2. An image sensor, as defined in claim 1, wherein said guiding means includes a first highly conductive layer of said first conductivity type located adjacent said one major surface and a second highly conductive layer of said first conductive type located adjacent an opposite major surface.

3. An image sensor, as defined in claim 1, wherein said charge collection and transfer means includes an N-type region of a buried-channel CCD.

4. An image sensor, as defined in claim 1, wherein said sensor includes a first column of said image sensor elements adjacent said one edge.

5. An image sensor, as defined in claim 4, wherein said sensor includes a second column of image sensor elements adjacent a second edge.

6. An image sensor, as defined in claim 5, wherein said sensor includes a third column of image sensor elements on one of said major surfaces and located between said first and second columns.

7. An image sensor, as defined in claim 6, wherein each of said image sensor elements in said third column includes a photodiode in the image sensing region.

8. An image sensor comprising:
a semiconductor substrate of a first conductivity type, said substrate having opposed major surfaces and opposed edges between said surfaces, said edges being receptive to light impinging on a surface thereof;
a row of image sensor elements in said substrate, a first element being adjacent one of said edges, a second element being adjacent an opposite edge, and a third element being adjacent one of said major surfaces, each of said elements including a storage gate for creating a storage region in said substrate and a transfer gate for effecting movement of charge carriers from said storage region to a charge collection and transfer means in said image sensor element; and
a highly conductive layer of said first conductivity type adjacent each of said major surfaces and extending to said opposed edges whereby charge carriers generated by light entering said edges are directed to the storage regions of said first and second elements.

9. An image sensor, as defined in claim 8, wherein said third element includes a photodiode.

10. An image sensor, as defined claim 8, wherein the charge collection and transfer means of each of said image sensor elements includes an N-type region of a buried-channel CCD.

11. An image sensor, as defined in claim 10, wherein said first and second elements have storage regions which extend to said edges.

12. An image sensor, as defined in claim 10, wherein each of said CCD's includes a clock terminal for shifting charge carriers out of said CCD.

13. An image sensor comprising:
a semiconductor substrate of a first conductivity type, said substrate having opposed major surfaces and opposed edges between said surfaces, one of said edges having an imaging plane on a surface thereof;
image sensor elements formed in said substrate adjacent said one edge, said elements including means for collecting charge carriers generated by light impinging on said imaging plane and means for transferring collected charge carriers out of the elements; and
layers of a highly doped material of said first conductivity type formed adjacent said surfaces and extending to said one edge, one of said layers extending between said image sensor elements and said one edge, said layers defining an aperture for the reception of light through said one edge and for guiding charge carriers into said collecting means.

14. An image sensor, as defined in claim 13, wherein said aperture is between about 1 micron and about 20 microns in width.

15. An image sensor, as defined in claim 13, wherein said first conductivity type is a P-type material.

* * * * *